United States Patent
Ogihara et al.

(10) Patent No.: US 10,811,247 B2
(45) Date of Patent: Oct. 20, 2020

(54) METHOD OF CLEANING AND DRYING SEMICONDUCTOR SUBSTRATE

(71) Applicant: SHIN-ETSU CHEMICAL CO., LTD., Tokyo (JP)

(72) Inventors: Tsutomu Ogihara, Joetsu (JP); Osamu Watanabe, Joetsu (JP); Takeshi Nagata, Joetsu (JP); Naoki Kobayashi, Joetsu (JP); Daisuke Kori, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 136 days.

(21) Appl. No.: 15/937,986

(22) Filed: Mar. 28, 2018

(65) Prior Publication Data

US 2018/0315594 A1    Nov. 1, 2018

(30) Foreign Application Priority Data

Apr. 27, 2017    (JP) .................................. 2017-88548

(51) Int. Cl.
| | |
|---|---|
| *H01L 21/02* | (2006.01) |
| *C11D 11/00* | (2006.01) |
| *B08B 3/08* | (2006.01) |
| *C11D 7/50* | (2006.01) |
| *C11D 7/28* | (2006.01) |
| *B81C 1/00* | (2006.01) |

(52) U.S. Cl.
CPC .......... *H01L 21/02071* (2013.01); *B08B 3/08* (2013.01); *B81C 1/00857* (2013.01); *B81C 1/00952* (2013.01); *C11D 7/28* (2013.01); *C11D 7/5018* (2013.01); *C11D 7/5022* (2013.01); *C11D 11/0047* (2013.01); *H01L 21/02057* (2013.01)

(58) Field of Classification Search
CPC ....... H01L 21/02071; B08B 3/08; C11D 7/28; C11D 7/5018; C11D 7/5022; C11D 11/0047
See application file for complete search history.

(56) References Cited

U.S. PATENT DOCUMENTS

| | | | |
|---|---|---|---|
| 2008/0066337 A1 | 3/2008 | Seki | |
| 2015/0221500 A1* | 8/2015 | Ogihara | ............ H01L 21/02068 134/19 |

(Continued)

FOREIGN PATENT DOCUMENTS

| | | | | |
|---|---|---|---|---|
| EP | 3396702 A1 * | 10/2018 | ............... | B08B 3/08 |
| JP | H01-140728 A | 6/1989 | | |

(Continued)

OTHER PUBLICATIONS

Dec. 13, 2018 Office Action and Search Report issued in Taiwanese Patent Application No. 107113766.

(Continued)

*Primary Examiner* — Sharidan Carrillo
(74) *Attorney, Agent, or Firm* — Oliff PLC

(57) ABSTRACT

A cleaning and drying method of a semiconductor substrate capable of suppressing collapse or breakdown of a pattern which occur at the time of drying a cleaning solution after cleaning the substrate and decomposition of a resin at a bottom of the pattern, and capable of removing the cleaning solution with good efficiency without using a specific device.

17 Claims, 1 Drawing Sheet

(56) References Cited

U.S. PATENT DOCUMENTS

| | | |
|---|---|---|
| 2016/0086829 A1 | 3/2016 | Limary et al. |
| 2016/0099160 A1 | 4/2016 | Sirard et al. |
| 2018/0215594 A1* | 8/2018 | Friederichs .............. B64D 1/22 |
| 2018/0315594 A1* | 11/2018 | Ogihara ................... B08B 3/08 |

FOREIGN PATENT DOCUMENTS

| | | |
|---|---|---|
| JP | H06-310486 A | 11/1994 |
| JP | H07-070599 A | 3/1995 |
| JP | 2005-072568 A | 3/2005 |
| JP | 2007-199653 A | 8/2007 |
| JP | 2008-098616 A | 4/2008 |
| JP | 2012-243869 A | 12/2012 |
| JP | 2014-011426 A | 1/2014 |
| JP | 2015-149384 A | 8/2015 |
| JP | 2015-162486 A | 9/2015 |
| TW | 201539157 A | 10/2015 |

OTHER PUBLICATIONS

Aug. 23, 2018 Extended Search Report issued in European Patent Application No. 18164566.4.
Dec. 10, 2019 Office Action issued in Japanese Patent Application No. 2017-088548.
May 26, 2020 Decision of Refusal issued in Japanese Patent Application No. 2017-88548.

* cited by examiner

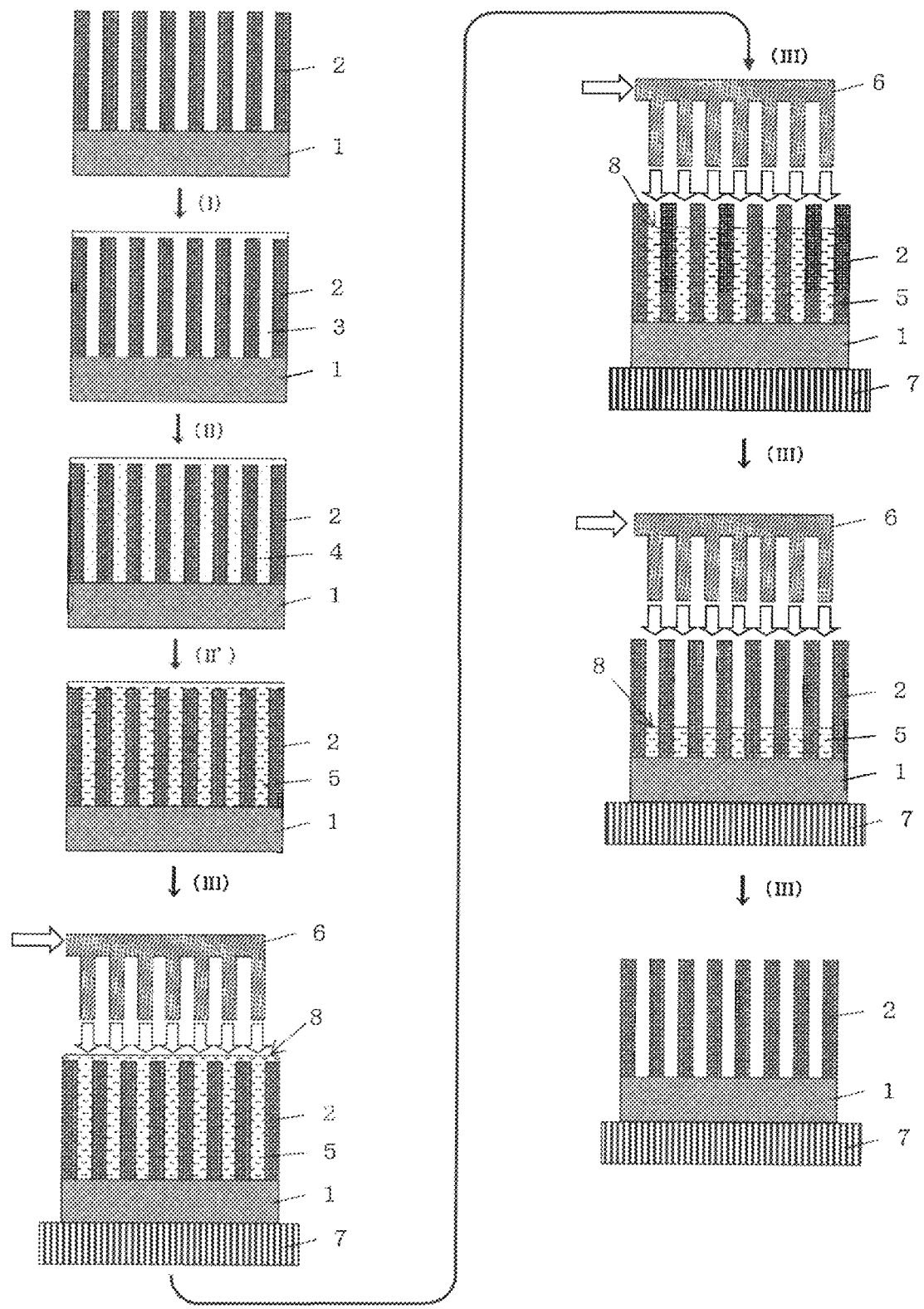

METHOD OF CLEANING AND DRYING SEMICONDUCTOR SUBSTRATE

TECHNICAL FIELD

The present invention relates to a method of cleaning and drying a semiconductor substrate onto which a pattern has been formed.

BACKGROUND ART

In recent years, as semiconductor apparatuses toward a high integration and a further acceleration in speed, a semiconductor apparatus having a three-dimensional structure is beginning to be proposed as well as improvement in integration degree by planar miniaturization by light exposure. Thus, the degree of substrate processing in the manufacturing process of the semiconductor apparatus is higher than before, and it has been processed into a substrate on which a thinner and deeper pattern is formed (hereinafter referred to as a high aspect substrate).

Such a processed substrate is usually processed by dry etching, cleaning and drying are essential for removing and cleaning fine particles, contamination and the like generated during the manufacturing process from the surface of the substrate. In particular, the drying is very important for preventing pattern collapse or pattern breakdown of the processed substrate and, for example, there have been proposed a method in which water used for cleaning the substrate is removed by using centrifugal force, or is substituted by isopropyl alcohol, and then, drying (Patent Documents 1 and 2), and a method of using various kinds of fluorine compounds (Patent Documents 3 and 4) and the like. However, when such a method is used in a recent high aspect substrate, problems are generated that collapse or breakdown of the pattern occurs at the time of drying, and water marks and the like occur due to insufficient drying of the cleaning solution.

As another method, there has been proposed a method in which breakdown of the pattern is prevented by cleaning with a cleaning solution at a supercritical state (Patent Document 5), but according to this method, there is a problem that the cost is increased since a specific device for handling the cleaning solution in a supercritical state is required.

The present inventors have proposed a cleaning and drying method in which a resin which is decomposable by either an acid or heat, or both of these is applied (Patent Document 6). According to this method, however, there is a case where the temperature is made higher than the decomposition temperature of the resin at the time of heating the substrate, so that decomposition and volatilization of the resin occur at the bottom of the pattern of the substrate (that is, the portion on the side of nearer to the substrate which is not exposed to the atmosphere), whereby collapse of the pattern could not be prevented depending on the aspect ratio of the pattern.

PRIOR ART DOCUMENTS

Patent Documents

Patent Document 1: Japanese Unexamined Patent publication (Kokai) No. H1-140728
Patent Document 2: Japanese Unexamined Patent publication (Kokai) No. H6-310486
Patent Document 3: Japanese Unexamined Patent publication (Kokai) No. H7-70599
Patent Document 4: Japanese Unexamined Patent publication (Kokai) No. 2008-98616
Patent Document 5: Japanese Unexamined Patent publication (Kokai) No. 2005-72568
Patent Document 6: Japanese Unexamined Patent publication (Kokai) No. 2015-149384

SUMMARY OF INVENTION

Technical Problem

The present invention was made in view of the above problems, and has an object to provide a method of cleaning and drying a semiconductor substrate, which is capable of suppressing collapse or breakdown of the pattern which occurs at the time of drying the cleaning solution after cleaning the substrate, further suppressing the decomposition of the resin at the bottom of the pattern as observed when the heat-decomposable resin is applied, and removing the cleaning solution efficiently, without using a specific device for handling a cleaning solution in a supercritical state.

Solution to Problem

In order to solve the problems, in the present invention, it is provided a method of cleaning and drying a semiconductor substrate which is a method of cleaning and drying a semiconductor substrate onto which a pattern has been formed, which comprises:
(I) cleaning the semiconductor substrate onto which a pattern has been formed with a cleaning solution,
(II) replacing the cleaning solution remained on the semiconductor substrate with a composition containing a resin (A) which contains a repeating unit having an acetal structure represented by the following general formula (1) and a solvent, and removing the solvent in the replaced composition by heating at a temperature lower than a decomposition temperature of the resin (A), and
(III) blowing a gas having a temperature equal to or higher than the decomposition temperature of the resin (A) to the resin (A) on the semiconductor substrate while maintaining a temperature of the semiconductor substrate onto which a pattern has been formed to 0° C. or higher and lower than the decomposition temperature of the resin (A), to decompose and remove the resin (A) from a side of a surface contacting with the gas,

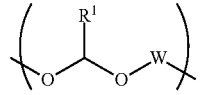

(1)

wherein, $R^1$ represents a hydrogen atom or a saturated or unsaturated monovalent organic group having 1 to 30 carbon atoms which may be substituted; and W represents a saturated or unsaturated divalent organic group having 2 to 30 carbon atoms.

When such a cleaning and drying method is employed, a resin having heat decomposability and flowability like that of the resin (A) and decomposed into a low molecular compound having high volatility after heat decomposition is used, it is possible to efficiently remove the cleaning solution by suppressing collapse or breakdown of the pattern which occurs at the time of drying the cleaning solution after cleaning the substrate without using a specific device which handles a cleaning solution in a supercritical state. Further, volatilization of the resin (A) at the bottom of the pattern can be suppressed by maintaining the semiconductor substrate having a pattern embedded with this resin (A) to a temperature of 0° C. or higher and lower than the decomposition temperature of the resin (A). Moreover, the resin (A) can be decomposed and volatilized sequentially from the side of a surface in contact with a gas by blowing the gas having a temperature equal to or higher than the decomposition temperature of the resin (A) to the resin (A). Accordingly, it is possible to provide a method for cleaning and drying a semiconductor substrate onto which a pattern having a high aspect ratio has been provided, which has been impossible conventionally.

At this time, the resin (A) is preferably a compound represented by either of the following general formulae (1a) to (1c),

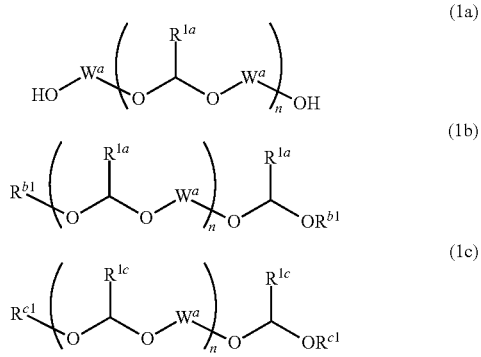

wherein, $R^{1a}$ represents an alkyl group having 1 to 4 carbon atoms or an alkenyl group having 2 to 4 carbon atoms; $W^a$ represents a saturated or unsaturated divalent hydrocarbon group having 4 to 10 carbon atoms, which may have an ether bond(s); each of $R^{b1}$ independently represents —$W^a$—OH, or a saturated or unsaturated monovalent organic group having 1 to 30 carbon atoms which may be substituted; $R^{1c}$ represents a hydrogen atom, or an aryl group having 6 to 20 carbon atoms or a heteroaryl group having 4 to 20 carbon atoms each of which may be substituted; each of $R^{c1}$ independently represents an alkyl group having 1 to 4 carbon atoms or —$W^a$—OH; and a repeating unit "n" represents an average number of repeating units and is 3 to 2,000.

Such a resin (A) is employed, it is excellent in flowability and can be easily decomposed and removed from the upper side of the surface of the coating film by selecting the structure and heating conditions.

At this time, the aspect ratio of the pattern is preferably 20:1 or more.

The cleaning and drying method of the present invention can effectively suppress the collapse or breakdown of a pattern particularly in a semiconductor substrate onto which such a pattern with a high aspect ratio has been formed.

Also, at this time, it is preferable that the cleaning solution is made a liquid containing at least one of water, a water-soluble alcohol and a fluorine compound.

The cleaning and drying method of the present invention can be applied regardless of the type of the cleaning solution, and when the cleaning and drying method of the present invention is applied particularly to drying such a cleaning solution, collapse or breakdown of the pattern can be suppressed effectively.

Further, at this time, it is preferable to keep the temperature of the semiconductor substrate onto which the pattern has been formed at 0° C. or higher and 100° C. or lower in the (III).

When such a temperature is employed, it is possible to prevent explosive decomposition and volatilization of the resin (A) at the bottom of the pattern, so that it is possible to reliably decompose and remove the resin (A) while suppressing collapse or breakdown of the pattern.

Moreover, at this time, it is preferable to use a gas containing either one of or both of a gas which shows acidity in an aqueous solution and water vapor as the gas to be blown to the resin (A).

By using such a gas, it is possible to decompose and remove the resin (A) more efficiently.

Furthermore, at this time, it is preferable to use a gas having a vapor pressure at 20° C. of 1,013 hPa or higher as the gas which shows acidity in an aqueous solution.

By using such a gas, the gas does not become a liquid and the resin (A) can be decomposed and removed in the order from the side of a surface in contact with the gas, so that it is possible to reliably prevent the collapse or breakdown of the pattern.

Still further, at this time, it is preferable that the pressure of the water vapor is set to be equal to or lower than the saturated vapor pressure of the water vapor at the temperature of the gas in the (III).

By employing such a constitution, it is possible to prevent the water vapor from being condensed in the semiconductor substrate onto the pattern has been formed by becoming the water vapor being supersaturated, so that it is possible to prevent the collapse or breakdown of the pattern.

Advantageous Effects of Invention

As stated above, according to the method of cleaning and drying the semiconductor substrate of the present invention, particularly in a substrate onto which a pattern having a high aspect ratio of 20:1 or more has been formed, it is possible to suppress the collapse or breakdown of the pattern which occurs at the time of drying the cleaning solution after cleaning the substrate, further suppress the decomposition of the resin at the bottom of the pattern as observed when the heat-decomposable resin is applied, whereby the cleaning solution can be removed efficiently without using a specific device such as supercritical cleaning. As a result, it is possible to obtain a semiconductor substrate without collapse or breakdown of the pattern, and fine particles or stain of which are removed by cleaning and dried.

BRIEF DESCRIPTION OF THE DRAWING

FIG. 1 is a process chart showing an example of a method of cleaning and drying a semiconductor substrate of the present invention.

DESCRIPTION OF EMBODIMENTS

As described above, it has been desired to develop a method of cleaning and drying a semiconductor substrate capable of suppressing collapse or breakdown of a substrate structure (pattern) which occurs at the time of drying a cleaning solution after cleaning the substrate, and suppressing decomposition of a resin at the bottom of the pattern which can be seen when a heat-decomposable resin is applied, and removing the cleaning solution efficiently without using a specific device such as cleaning with a cleaning solution in a supercritical state.

The present inventors have intensively studied to solve the problems, and as a result, they have found that when a method of drying a substrate which is not directly drying a cleaning solution, but after replacing the cleaning solution with a polymer compound (a resin (A)) decomposable by heat, the cleaning solution is removed by decomposing and removing the resin (A) from the side opposite to the substrate without decomposing the resin (A) from the side of the semiconductor substrate is employed, deformation of the structure due to the stress to the substrate structure generated at the time of drying by filling the resin (A) into the gaps of the substrate structure, and breakdown can be prevented, and finally, collapse or breakdown of the substrate structure can be suppressed by removing the resin (A) which became a solid by vaporizing from the side of the surface in contact with a gas while suppressing the decomposition of the resin (A) from the side of the substrate, and the cleaning solution can be removed and dried efficiently, whereby they have accomplished the present invention.

That is, the present invention relates to a method of cleaning and drying a semiconductor substrate which is a method of cleaning and drying a semiconductor substrate onto which a pattern has been formed, which comprises:
(I) cleaning the semiconductor substrate onto which a pattern has been formed with a cleaning solution,
(II) replacing the cleaning solution remained on the semiconductor substrate with a composition containing a resin (A) which contains a repeating unit having an acetal structure represented by the following general formula (1) and a solvent, and removing the solvent in the replaced composition by heating at a temperature lower than a decomposition temperature of the resin (A), and
(III) blowing a gas having a temperature equal to or higher than the decomposition temperature of the resin (A) to the resin (A) on the semiconductor substrate while maintaining a temperature of the semiconductor substrate onto which a pattern has been formed to 0° C. or higher and lower than the decomposition temperature of the resin (A), to decompose and remove the resin (A) from a side of a surface contacting with the gas,

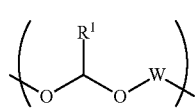

(1)

wherein, $R^1$ represents a hydrogen atom or a saturated or unsaturated monovalent organic group having 1 to 30 carbon atoms which may be substituted; and W represents a saturated or unsaturated divalent organic group having 2 to 30 carbon atoms.

In the following, the present invention will be explained in detail, but the present invention is not limited by these.
<Resin (A)>

First, the resin (A) to be used for the method of cleaning and drying the semiconductor substrate of the present invention will be explained. The resin (A) is a compound (hereinafter also referred to as the "heat-decomposable polymer (1)") containing a repeating unit which has an acetal structure represented by the following general formula (1), and a resin which decomposes by heat, or decomposes by both of an acid and heat. In the following, the resin (A) to be decomposed in such a manner is sometimes referred to as the "heat-decomposable polymer" for convenience, and as the resin (A), a material which is decomposed by both of an acid and heat may be used,

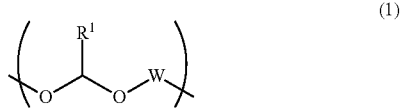

(1)

wherein, $R^1$ represents a hydrogen atom or a saturated or unsaturated monovalent organic group having 1 to 30 carbon atoms which may be substituted; and W represents a saturated or unsaturated divalent organic group having 2 to 30 carbon atoms.

In the general formula (1), $R^1$ represents a hydrogen atom or a saturated or unsaturated monovalent organic group having 1 to 30 carbon atoms which may be substituted. Here, in the present invention, the terms "organic group" means a group containing at least one carbon, and further includes hydrogen, and may contain nitrogen, oxygen, sulfur, silicon, halogen atoms and the like.

$R^1$ may be a single kind or a plural number of kinds which may be mixedly present. $R^1$ may be more specifically exemplified by a hydrogen atom, a methyl group, an ethyl group, a vinyl group, a 2,2,2-trifluoroethyl group, a propyl group, an isopropyl group, an allyl group, a 1-propenyl group, an isopropenyl group, a butyl group, an s-butyl group, a t-butyl group, an isobutyl group, a pentyl group, a cyclopentyl group, a hexyl group, a cyclohexyl group, a cyclohexenyl group, a decyl group, a dodecyl group, an eicosyl group, a norbornyl group, a adamantyl group, a phenyl group, a toluyl group, a xylyl group, a naphthyl group, a phenanthrenyl group, an anthracenyl group, a benzyl group, a fluorenyl group, a naphthylmethyl group, a norbornenyl group, a triacontyl group, a 2-furanyl group, a 2-tetrahydrofuranyl group and the like.

In the general formula (1), W represents a saturated or unsaturated divalent organic group having 2 to 30 carbon atoms. W may be a single kind or a plural number of kinds which may be mixedly present. W may be more specifically exemplified by an ethylene group, a propylene group, a butylene group, a trimethylene group, a tetramethylene group, a pentamethylene group, a hexamethylene group, a heptamethylene group, an octamethylene group, a decamethylene group, a dodecamethylene group, an eicosamethylene group, a triacontamethylene group, a cyclopentanediyl group, a cyclohexanediyl group, a dimethylcyclohexanediyl group, a 2-buten-1,4-diyl group, a 2,4-hexadien-1,6-diyl group, a 3-oxapentan-1,5-diyl group, a 3,6-dioxaoctan-1,8-diyl group, a 3,6,9-trioxaundecan-1,11-diyl group, a phenylene group, a xylylene group, a naphthalenediyl group, a dimethylnaphthalenediyl group, an adamantanediyl group and the like.

The heat-decomposable polymer may contain a single kind of a repeating unit as the repeating unit which has an acetal structure represented by the general formula (1), or may contain two or more kinds of the repeating units in combination.

The repeating unit which has an acetal structure represented by the general formula (1) may be specifically exemplified by the following, but the invention is not limited by these,

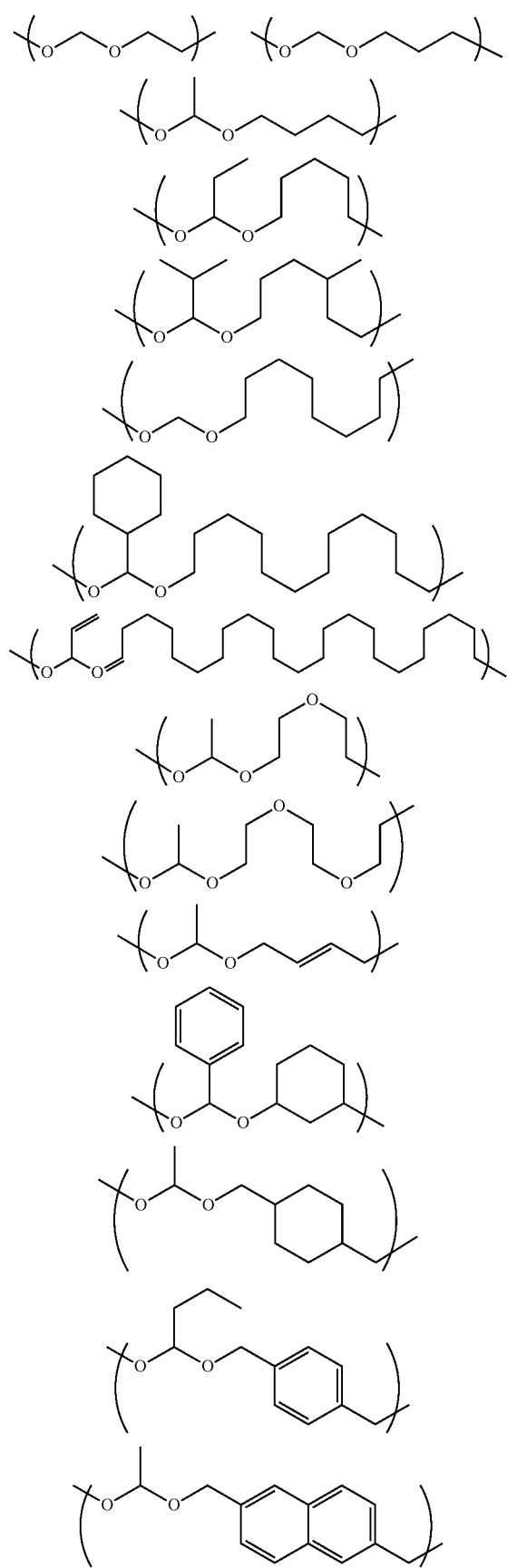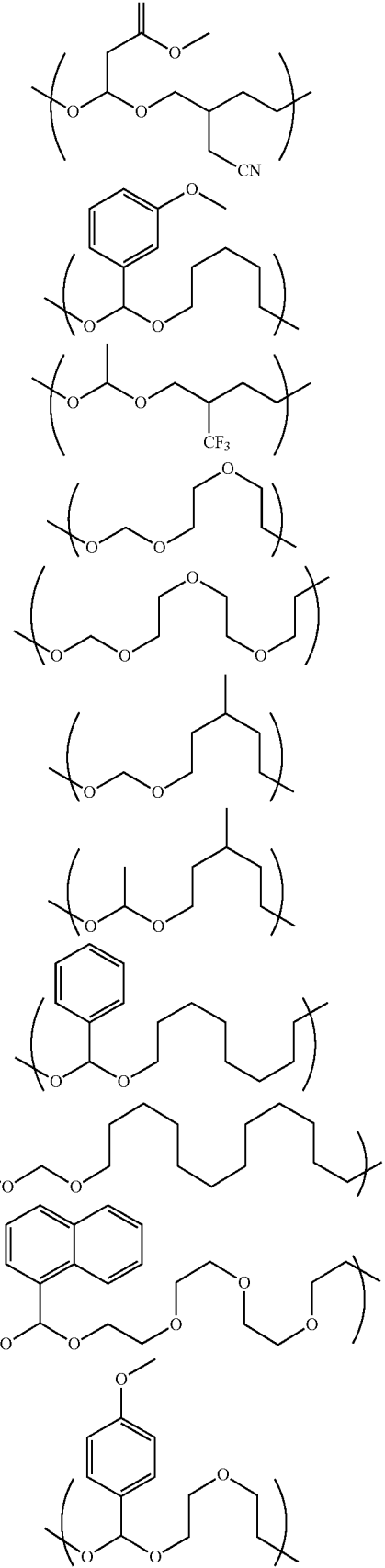

-continued

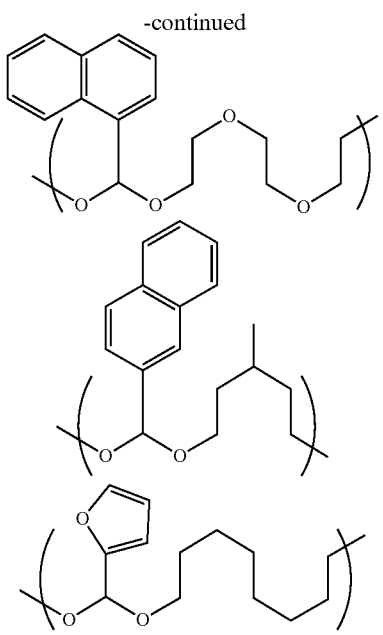

The presence of the chain acetal structure represented by the general formula (1) is effective for imparting appropriate heat decomposability and flowability to the heat-decomposable polymer. Further, after heat decomposition, it is decomposed into low molecular weight compounds with high volatility, so that it is possible to remove these since the resin (A) does not apply its stress to the substrate. That is, by directly vaporizing from the solid (polymer) without passing through the liquid, the surface tension does not act on the substrate structure as in the supercritical cleaning technique, so that it is possible to prevent the breakdown of the substrate structure.

Further, as a preferable embodiment of the heat-decomposable polymer (1) may be mentioned a compound (hereinafter sometimes referred to as "heat-decomposable polymer (1a) to (1c)") represented by any of the following general formula (1a) to (1c),

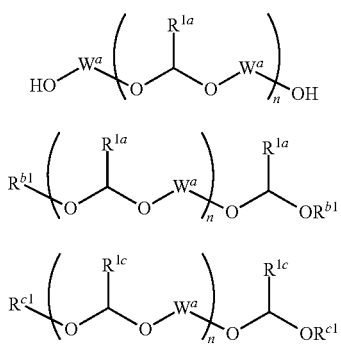

wherein, $R^{1a}$ represents an alkyl group having 1 to 4 carbon atoms or an alkenyl group having 2 to 4 carbon atoms; $W^a$ represents a saturated or unsaturated divalent hydrocarbon group having 4 to 10 carbon atoms, which may have an ether bond(s); each of $R^{b1}$ independently represents —$W^a$—OH, or, a saturated or unsaturated monovalent organic group having 1 to 30 carbon atoms which may be substituted: $R^{1c}$ represents a hydrogen atom, or an aryl group having 6 to 20 carbon atoms or a heteroaryl group having 4 to 20 carbon atoms each of which may be substituted; each of $R^{c1}$ independently represents an alkyl group having 1 to 4 carbon atoms or —$W^a$—OH; and a repeating unit "n" represents an average number of repeating units and is 3 to 2,000.

In the general formulae (1a) and (1b), $R^{1a}$ each independently represent an alkyl group having 1 to 4 carbon atoms or an alkenyl group having 2 to 4 carbon atoms; and $R^{1a}$ may be a single kind or a plural number of kinds which may be mixedly present. $R^{1a}$ may be more specifically exemplified by a methyl group, an ethyl group, a propyl group, an isopropyl group, a butyl group, an s-butyl group, a t-butyl group, an isobutyl group and the like.

In the general formula (1a) to (1c), $W^a$ represents a saturated or unsaturated divalent hydrocarbon group having 4 to 10 carbon atoms, which may have an ether bond(s); and $W^a$ may be a single kind or a plural number of kinds which may be mixedly present. $W^a$ may be more specifically exemplified by a tetramethylene group, a pentamethylene group, a hexamethylene group, a heptamethylene group, an octamethylene group, a decamethylene group, a cyclopentandiyl group, a cyclohexanediyl group, a dimethylcyclohexanediyl group, a 2-buten-1,4-diyl group, a 2,4-hexadien-1,6-diyl group, a 3-oxapentan-1,5-diyl group, a 3,6-dioxaoctan-1,8-diyl group, a 3,6,9-trioxaundecan-1,11-diyl group, a phenylene group, a xylylene group, an adamantandiyl group and the like.

In the general formula (1b), each of $R^{b1}$ independently represents —$W^a$—OH, or, a saturated or unsaturated monovalent organic group having 1 to 30 carbon atoms which may be substituted. The saturated or unsaturated monovalent organic group having 1 to 30 carbon atoms which may be substituted may be specifically exemplified by a methyl group, an ethyl group, a vinyl group, a 2,2,2-trifluoroethyl group, a propyl group, an isopropyl group, an allyl group, a 1-propenyl group, an isopropenyl group, a butyl group, an s-butyl group, a t-butyl group, an isobutyl group, a pentyl group, a cyclopentyl group, a hexyl group, a cyclohexyl group, a cyclohexenyl group, a decyl group, a dodecyl group, an eicosanyl group, a norbornyl group, an adamantyl group, a phenyl group, a toluyl group, a xylyl group, a naphthyl group, a phenanthrenyl group, an anthracenyl group, a benzyl group, a fluorenyl group, a naphthylmethyl group, a norbornenyl group, a triacontyl group, a 2-furanyl group, a 2-tetrahydrofuranyl group and the like.

In the general formula (1c), $R^{1c}$ represents a hydrogen atom, or an aryl group having 6 to 20 carbon atoms or a heteroaryl group having 4 to 20 carbon atoms each of which may be substituted. $R^{1c}$ may be a single kind or a plural number of kinds which may be mixedly present. $R^{1c}$ may be specifically exemplified by a hydrogen atom, a phenyl group, a toluyl group, a xylyl group, a naphthyl group, a phenanthrenyl group, an anthracenyl group, a 2-furanyl group, an anisyl group and the like.

In the general formula (1c), each of $R^{c1}$ independently represents an alkyl group having 1 to 4 carbon atoms or —$W^a$—OH. The alkyl group having 1 to 4 carbon atoms may be specifically exemplified by a methyl group, an ethyl group, a propyl group, an isopropyl group, a butyl group, an s-butyl group, a t-butyl group, an isobutyl group and the like.

The repeating unit "n" represents an average number of the repeating units, and is 3 to 2,000, preferably 3 to 500, more preferably 5 to 300.

The compound represented by the general formula (1a) may be specifically exemplified by the following, but it is not limited by these. In the following formulae, the repeating unit "n" represents the same meaning as before.

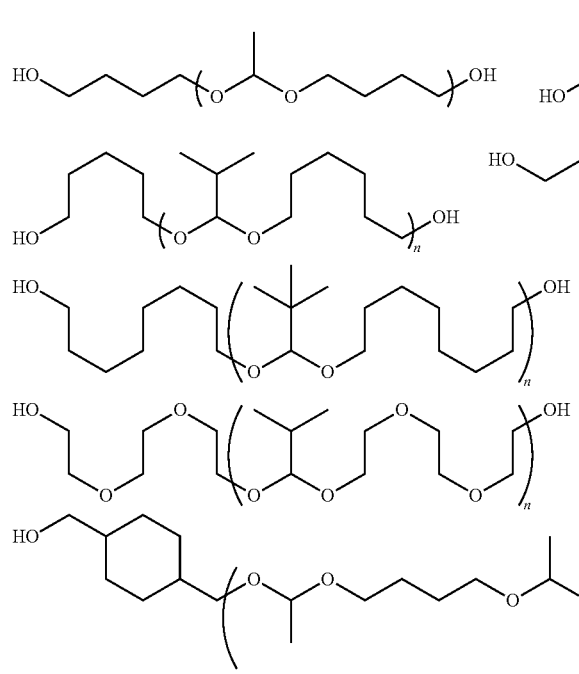
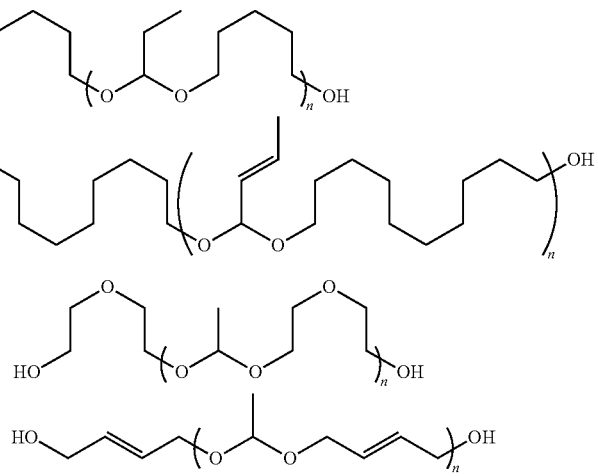

The compound represented by the general formula (1b) may be specifically exemplified by the following, but it is not limited by these. In the following formulae, the repeating unit "n" represents the same meaning as before.

-continued

The compound represented by the general formula (1c) may be specifically exemplified by the following, but it is not limited by these. In the following formulae, the repeating unit "n" represents the same meaning as before.

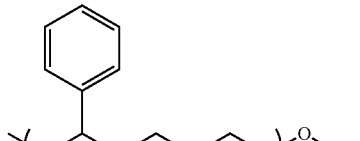

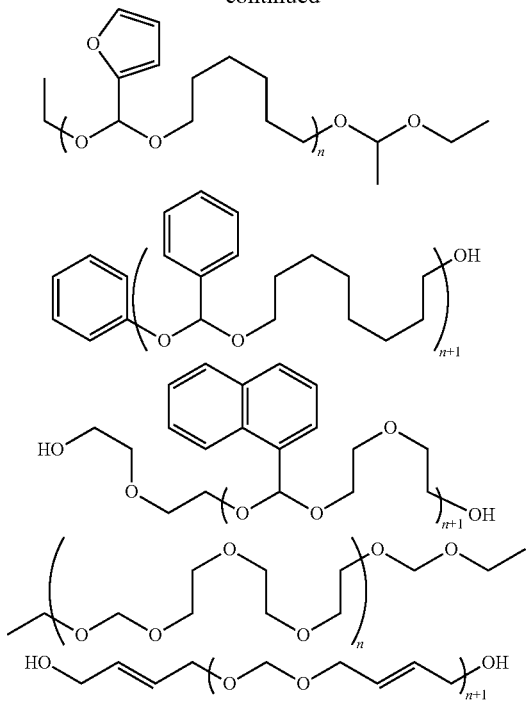

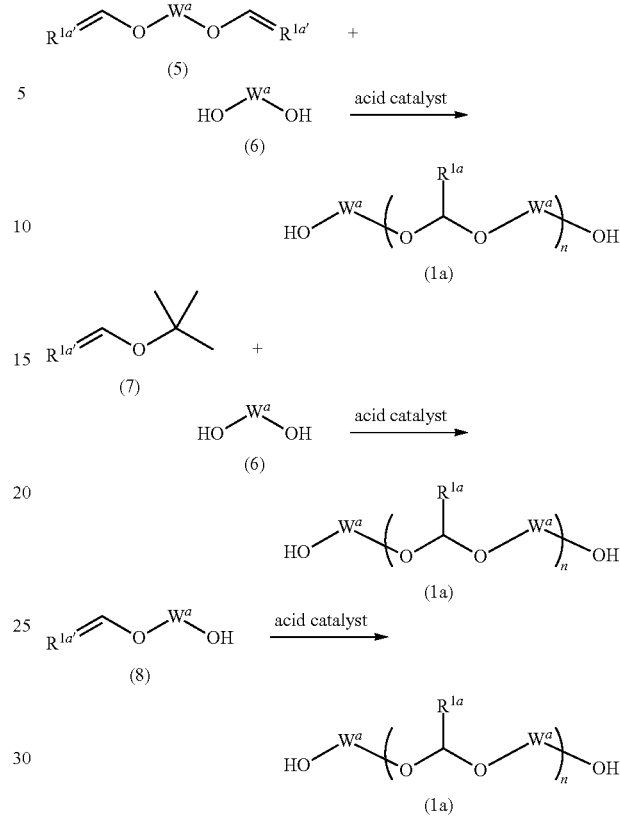

By selecting the structures of $R^1$, $R^{1a}$, $R^{b1}$, $R^{1c}$, $R^{c1}$, W, and $W^a$, it is possible to adjust the characteristics such as the heat decomposition temperature, the thermal weight loss, flowability and the like of the heat-decomposable polymer. In particular, the heat-decomposable polymers (1a) to (1c) are excellent in flowability and can easily be formed on the upper side of the surface of the coating film (that is, on the side of the surface in contact with the gas) of the side wall by selecting the structures of $R^{1a}$, $R^{1c}$, and $W^a$ or heating conditions. The heat-decomposable polymers (1a) and (1b) are preferable because the heat decomposition temperature is low, and, as a result, the temperature of the gas at the time of decomposition and removal can be lowered. The heat-decomposable polymer (1c) sometimes functions as a cross-linking agent, and it is preferable because it allows further broadening of the range of adjustment of characteristics of the heat-decomposable polymer.

A weight average molecular weight of the heat-decomposable polymer is preferably 300 to 200,000, more preferably 300 to 50,000, and further preferably 500 to 40,000. If the weight average molecular weight is 300 or more, it is possible to suppress the deterioration of the formulating effect due to volatilization or the like, and sufficient formulation effect can be obtained. In addition, if the weight average molecular weight is 200,000 or less, flowability and the like are not deteriorated, and the embedding and flattening characteristics are excellent.

(Method for Producing Heat-Decomposable Polymer)

The heat-decomposable polymers having the structures represented by the general formulae (1) or (1a) to (1c) can be produced by selecting the optimum method depending on the structure. When the heat-decomposable polymer (1a) is taken as an example, it can be specifically produced, for example, by the method selecting from the following three methods. It is possible to produce the heat-decomposable polymer (1) other than the heat-decomposable polymer (1a) by the same method. The method for producing the heat-decomposable polymer used in the present invention is not limited to these methods.

Wherein, $R^{1a}$, $W^a$, and the repeating unit "n" represent the same meanings as before; and $R^{1a'}$ represents a divalent group in which one hydrogen is removed from $R^{1a}$.

The reaction is a general acetal formation reaction by an acid catalyst as an elementary reaction. By proceeding the elementary reaction repeatedly, a polymer can be given finally. In the reaction, an optimum amount of the diol compound (6) to be used based on the diether compound (5) is preferably 0.5 mol to 2 mol of the diol compound (6), particularly 0.8 mol to 1.2 mol based on 1 mol of the diether compound (5). In the reaction, an optimum amount of the diol compound (6) to be used based on the t-butyl ether compound (7) is preferably 0.5 mol to 2 mol of the diol compound (6), particularly 0.8 mol to 1.2 mol based on 1 mol of the t-butyl ether compound (7).

The acetal formation reaction can be carried out by mixing the respective starting materials with an acid catalyst in a solvent or in the absence of a solvent, and subjecting to cooling or heating. When a solvent is used for the reaction, the solvent may be used singly or two or more kinds in admixture by selecting from an aliphatic hydrocarbon such as hexane, heptane and the like; an aromatic hydrocarbon such as toluene, xylene, trimethylbenzene, methylnaphthalene and the like; an ether such as diethyl ether, dibutyl ether, diethylene glycol diethyl ether, diethylene glycol dimethyl ether, tetrahydrofuran and the like; a ketone such as acetone, 2-butanone and the like; an alcohol such as t-butyl alcohol, t-amyl alcohol and the like; an ester such as ethyl acetate, propylene glycol monomethyl ether acetate, γ-butyrolactone and the like; a nitrile such as acetonitrile and the like; an amide such as N,N-dimethylformamide, N,N-dimethylacetamide and the like; a halogenated hydrocarbon such as o-dichlorobenzene, methylene chloride, 1,2-dichloroethane and the like.

As the acid catalyst to be used for the reaction, various kinds of inorganic acids and organic acids may be used, and specifically mentioned an acid catalyst such as hydrochloric acid, nitric acid, sulfuric acid, formic acid, oxalic acid, acetic acid, methanesulfonic acid, camphorsulfonic acid, tosic acid, trifluoromethanesulfonic acid, a cation exchange resin, sodium hydrogen sulfate, pyridinium p-toluenesulfonate and the like. An amount of these acid catalysts to be used is preferably $1 \times 10^{-5}$ to $5 \times 10^{-1}$ mol based on 1 mol in total of the starting materials.

A reaction temperature is preferably −20° C. to 100° C., and more preferably 0° C. to 80° C. When the solvent is used, it is preferable to set the upper limit to the boiling point of the solvent. If the reaction temperature is −20° C. or higher, the reaction proceeds smoothly, while if it is 100° C. or lower, a side reaction such as a decomposition reaction of the product can be suppressed.

A reaction time is preferably determined by tracing the progress of the reaction by using thin layer chromatography, liquid chromatography, gel filtration chromatography and the like to improve the yield, and is generally 0.5 to 200 hours or so. After completion of the reaction, the heat-decomposable polymer (1a) which is an objective material can be obtained by the usual aqueous system post-treatment (aqueous work-up) and/or filtration treatment of insoluble materials.

The resulting heat-decomposable polymer (1a) may be purified, if necessary, by the conventional method such as liquid separation, crystallization, condensation under reduced pressure, dialysis, ultrafiltration and the like depending on the characteristics thereof. In addition, a metal content can also be reduced by passing through a commercially available demetallization filter, if necessary.

As a method of the reaction, there may be employed, for example, a method in which respective starting materials, an acid catalyst, and, if necessary, a solvent are charged all at once, a method in which respective starting materials or a solution of the starting materials is/are added dropwise solely or in admixture in the presence of a catalyst, or a method in which mixed starting materials or a solution of the mixed starting materials is/are passed through a column filled with an acid catalyst in a solid state. With regard to the adjustment of the molecular weight, there may be carried out, for example, control by a reaction time, control by an amount of the acid catalyst, control by addition or adjusting a content of a polymerization terminator such as water, an alcohol and a basic compound, control by a ratio of charging starting materials when the starting materials are used two kinds, or control in which a plurality of these are combined.

Each of the starting material compounds represented by the general formulae (5) to (8) may be used alone or in combination of two or more kinds. The compound such as the starting material compounds and the like represented by the general formulae (5), (7) and (8) may be unstable to oxygen, light, moisture and the like in some cases, and in such a case, it is preferable to carry out the reaction in an inert atmosphere such as nitrogen or the like, and under light shielding.

In addition, the heat-decomposable polymers (1b) and (1c) can be specifically produced, for example, by selecting from the following two methods. The heat-decomposable polymers (1) other than the heat-decomposable polymers (1b) and (1c) can be also produced by the same method. The method for producing the heat-decomposable polymer to be used in the present invention is not limited to these methods.

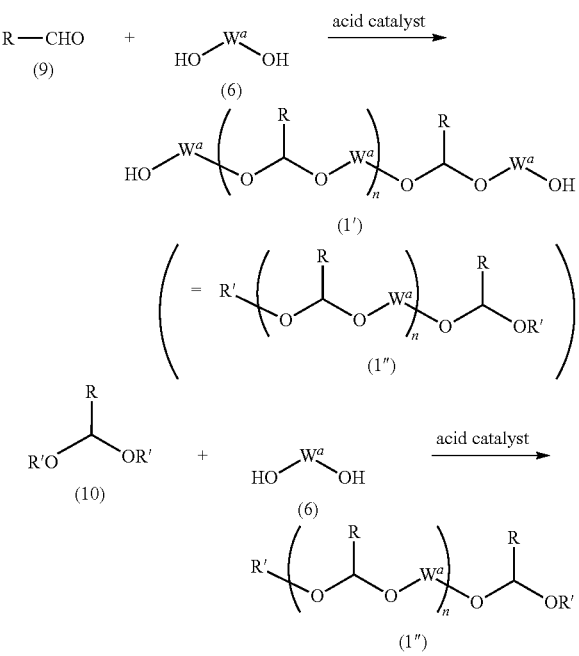

wherein, R represents $R^{1a}$ or $R^{1c}$; R' represents $R^{b1}$ or $R^{c1}$; and $W^a$, $R^{1a}$, $R^{b1}$, $R^{1c}$, $R^{c1}$, and the repeating unit "n" represent the same meanings as before.

The reaction is a general acetal formation by an acid catalyst as an elementary reaction. By proceeding the elementary reaction repeatedly, a polymer can be given finally. In the reaction, an optimum amount of the diol compound (6) to be used based on the aldehyde compound (9) is preferably 0.5 mol to 2 mol of the diol compound (6), particularly 0.8 mol to 1.2 mol based on 1 mol of the aldehyde compound (9). In the reaction, an optimum amount of the diol compound (6) to be used based on the acetal compound (10) is preferably 0.5 mol to 2 mol of the diol compound (6), particularly 0.8 mol to 1.2 mol based on 1 mol of the acetal compound (10).

The acetal formation reaction can be carried out by mixing the respective starting materials with an acid catalyst in a solvent or in the absence of a solvent, and subjecting to cooling or heating. When a solvent is used for the reaction, the same solvent to be used in the method for producing the heat-decomposable polymer (1a) may be used.

As the acid catalyst to be used for the reaction, various kinds of inorganic acids and organic acids may be used, and specifically the same ones to be used in the method for producing the heat-decomposable polymer (1a) may be used. Also, an amount of the acid catalyst used may be the same amount as that of the method for producing the heat-decomposable polymer (1a).

A reaction temperature is preferably 0° C. to 250° C., and more preferably 20° C. to 200° C. When a solvent is used, it is preferable to set the upper limit to the boiling point of the solvent. If the reaction temperature is 0° C. or higher, the reaction proceeds smoothly, while if it is 250° C. or lower, a side reaction such as a decomposition reaction of the product can be suppressed.

A reaction time is preferably determined by tracing the progress of the reaction by using thin layer chromatography, liquid chromatography, gel filtration chromatography and the like to improve the yield, and is generally 0.5 to 200 hours or so. After completion of the reaction, the heat-decomposable polymer (1″), i.e., the heat-decomposable polymer (1b) or the heat-decomposable polymer (1c), which is an objective material can be obtained by the usual aqueous system post-treatment (aqueous work-up) and/or filtration treatment of insoluble materials.

The resulting heat-decomposable polymer (1″) may be purified, if necessary, by the conventional method such as liquid separation, crystallization, condensation under reduced pressure, dialysis, ultrafiltration and the like depending on the characteristics thereof. In addition, a metal content can also be reduced by passing through a commercially available demetallization filter, if necessary.

As a method of the reaction, there may be employed, for example, a method in which respective starting materials, an acid catalyst, and, if necessary, a solvent are charged all at once, a method in which respective starting materials or a solution of the starting materials is/are added dropwise solely or in admixture in the presence of a catalyst, or a method in which mixed starting materials or a solution of the mixed starting materials is/are passed through a column filled with an acid catalyst in a solid state. It is preferable that the reaction is carried out while distilling off water or an alcohol produced by the reaction, since the reaction rate can be improved. With regard to the adjustment of the molecular weight, there may be carried out, for example, control by a reaction time, control by an amount of the acid catalyst, control by addition or adjusting a content of a polymerization terminator such as water, an alcohol and a basic compound, control by a ratio of charging a starting material (s), or control in which a plurality of these are combined.

As the resin (A), that which is decomposed by both of an acid and heat may be used. In the case of using such a resin (A), when the resin (A) is removed, it is preferable to use a gas which shows acidity in an aqueous solution as a gas to be blown to the resin (A) mentioned later, but a volatile acid may be used. In addition, an acid generator may be added to the solution of the composition together with the resin (A). By adding an acid generator, the resin (A) is not decomposed in the state of the solution of the composition, and the resin (A) can be decomposed by generating an acid from the acid generator after replacing the cleaning solution. That is, in addition to heat-decomposition by blowing the gas, decomposition by an acid can also be carried out, so that the resin (A) can be removed more efficiently. The acid generator to be used in the present invention is preferably a material which generates an acid by heat-decomposition, and specifically a material disclosed at the paragraphs (0061) to (0085) in Japanese Unexamined Patent publication (Kokai) No. 2007-199653 can be added.

Further, when an acid generator is used, a basic compound may be formulated for preventing the decomposition of the resin (A) by the action of an acid generated during a dark reaction of the acid generator at room temperature and for improving storage stability. As such a basic compound, specifically a material disclosed at the paragraphs (0086) to (0090) in Japanese Unexamined Patent publication (Kokai) No. 2007-199653 can be added.

<Organic Solvent>

The resin (A) to be used in the method of cleaning and drying the semiconductor substrate of the present invention is used in the state of a solution of a composition in which it is dissolved in an organic solvent. The organic solvent to be used for dissolving the resin (A) is not particularly limited as long as it can dissolve the resin (A). Such an organic solvent may be specifically mentioned a ketone such as 2-heptanone, cyclopentanone, cyclohexanone and the like; an alcohol such as 3-methoxybutanol, 3-methyl-3-methoxybutanol, 1-methoxy-2-propanol, 1-ethoxy-2-propanol and the like; an ether such as propylene glycol monomethyl ether, ethylene glycol monomethyl ether, propylene glycol monoethyl ether, ethylene glycol monoethyl ether, propylene glycol dimethyl ether, diethylene glycol dimethyl ether and the like; an ester such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, γ-butyrolactone, propylene glycol mono-t-butyl ether acetate and the like, and these may be used a single kind alone or two or more kinds in admixture, but the invention is not limited by these.

Among these, in particular, preferably used are propylene glycol monomethyl ether acetate, propylene glycol monomethyl ether, 2-heptanone, cyclopentanone, cyclohexanone, γ-butyrolactone, and a mixture of two or more kinds of these.

A formulation amount of the organic solvent is preferably 200 to 10,000 parts by mass based on 100 parts by mass of the resin (A), and particularly preferably 300 to 5,000 parts by mass.

<Substrate>

A substrate to which the cleaning and drying method of the present invention can be applied has, for example, a pillar pattern structure and/or a hole pattern structure on the surface of the substrate. The pillar pattern structure and/or the hole-like pattern structure may be square or circular. Also, it may be a square pole or a circular column each having a hollow in the central part, or it may be a square hole or a circular hole each having a column in the central part. The pattern structure is not specifically limited, and it may be formed by general dry etching.

In the conventional cleaning and drying method, breakdown of the pattern occurs when it is applied to a pattern having a large aspect ratio (a ratio of height (or depth)/short side (or diameter)). In contrast, the cleaning and drying method of the present invention is particularly effective for a pillar pattern structure and/or a hole-like pattern structure each having a large aspect ratio. The aspect ratio of the pattern formed onto the substrate to be used in the cleaning and drying method of the present invention is preferably 10:1 or more, more preferably 20:1 or more, further preferably 50:1 or more, and particularly preferably 70:1 or more. Further, in the present invention, with regard to the size of the short side (or diameter) of the pillar pattern and/or the short side (or inner diameter) of the hole-like pattern, the effect can be particularly shown at the size of 3 to 1,000 nm, and further it can be remarkably shown at the size of 5 to 500 nm.

As a material constituting the substrate structure, there may be exemplified by a metal film comprising silicon, titanium, tungsten, hafnium, zirconium, chromium, germanium, copper, aluminum, indium, gallium, arsenic, palladium, iron, tantalum, iridium, molybdenum, or an alloy thereof, a metal carbide film, a metal oxide film, a metal nitride film, a metal oxycarbide film, or a metal oxynitride film and the like.

<Cleaning Solution>

The cleaning and drying method of the present invention can be applied regardless of the kind of the cleaning solution, and in particular, when a liquid containing at least one of water, a water-soluble alcohol and a fluorine compound is used as the cleaning solution and the cleaning and drying method of the present invention is applied thereto, it is preferable since collapse or breakdown of the pattern can be effectively suppressed.

<Cleaning and Drying Method>

The present invention relates to a method of cleaning and drying a semiconductor substrate onto which a pattern has been formed, which comprises (I) cleaning the semiconductor substrate onto which a pattern has been formed with a cleaning solution, (II) replacing the cleaning solution remained on the semiconductor substrate with a composition containing a resin (A) which contains a repeating unit having an acetal structure represented by the following general formula (1) and a solvent, and removing the solvent in the replaced composition by heating at a temperature lower than a decomposition temperature of the resin (A), and (III) blowing a gas having a temperature equal to or higher than the decomposition temperature of the resin (A) to the resin (A) on the semiconductor substrate while maintaining a temperature of the semiconductor substrate onto which a pattern has been formed to 0° C. or higher and lower than the decomposition temperature of the resin (A), to decompose and remove the resin (A) from a side of a surface contacting with the gas,

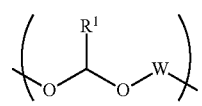

(1)

wherein, $R^1$ represents a hydrogen atom or a saturated or unsaturated monovalent organic group having 1 to 30 carbon atoms which may be substituted; and W represents a saturated or unsaturated divalent organic group having 2 to 30 carbon atoms.

In the following, the cleaning and drying method of the present invention will be explained in more detail by referring to the drawing, but the cleaning and drying method of the present invention is not limited thereto.

FIG. 1 is a process chart showing an example of a method of cleaning and drying a semiconductor substrate of the present invention. In the method of cleaning and drying a semiconductor substrate of the present invention shown in FIG. 1, as (I), a semiconductor substrate 1 onto which a pattern 2 has been formed is firstly subjected to cleaning with a cleaning solution 3. Next, as (II), the cleaning solution 3 remained on the semiconductor substrate 1 is replaced with a solution 4 of a composition containing a resin (A). Next, as (II'), the organic solvent in the solution 4 of the composition containing the resin (A) is removed by heating to a temperature at which the resin (A) does not decompose and the organic solvent volatilizes, to bury the gaps of the pattern 2 with the resin (A) 5. Finally, as (III), while maintaining a temperature of the semiconductor substrate 1 to 0° C. or higher and lower than the decomposition temperature of the resin (A) by a cooling plate 7, a gas having a temperature equal to or higher than the decomposition temperature of the resin (A) is blown to the resin (A) 5 by an air blower 6 whereby the resin (A) 5 is decomposed and removed from the side of the surface 8 in contact with the gas. The hollow arrow in FIG. 1 indicates the flow of gas.

In the cleaning and drying method of the present invention, after cleaning with the cleaning solution, the cleaning solution remained on the semiconductor substrate is thus replaced with a solution of a composition containing the resin (A), and further the organic solvent in the solution of the composition is volatilized to bury the gaps in the pattern. According to this procedure, collapse or breakdown of the pattern can be prevented. Next, a gas (hot air or the like) with a high temperature is blowing to the resin (A) to decompose and remove the resin (A) from the side of the surface contacting with the gas, whereby the resin (A) is removed without the resin (A) exerts a stress on the substrate, and the substrate can be dried. That is, by directly vaporizing from the solid (polymer) without passing through the liquid, the surface tension does not act on the substrate structure as in the supercritical cleaning technique, so that it is possible to prevent the breakdown of the pattern.

The heating and removal of the solvent in the composition in the (II) is carried out at a temperature lower than the decomposition temperature of the resin (A). The decomposition temperature of the resin (A) herein mentioned means a baking temperature at which the film thickness of the polymer film is 50% of the film thickness before baking by coating a composition containing the resin (A) and the solvent and then the solvent is removed to form a polymer film, and the wafer is baked for 1 minute. The decomposition temperature of the resin (A) varies depending on the structure of the resin (A), and it is 200° C. or lower in most cases.

The decomposition and removal of the resin (A) in the (III) can be carried out by blowing a gas having a temperature equal to or higher than the decomposition temperature of the resin (A) to the resin (A) on the semiconductor substrate while maintaining the temperature of the semiconductor substrate onto which the pattern has been formed to 0° C. or higher and lower than the decomposition temperature of the resin (A). At this time, the temperature of the semiconductor substrate is preferably maintained to 0° C. or higher and 100° C. or lower. The means for maintaining the temperature of the semiconductor substrate at a predetermined temperature is not particularly limited, and may be mentioned, for example, a method of cooling with a cooling plate and the like. Thus, by maintaining the temperature of the semiconductor substrate to a temperature lower than the decomposition temperature of the resin (A), decomposition and volatilization of the resin (A) at the bottom of the pattern can be prevented and occurrence of collapse of the pattern can be prevented.

In the (III), the temperature of the gas to be blown to the resin (A) is a temperature equal to or higher than the decomposition temperature of the resin (A), preferably a temperature at which 20% by mass or less of the resin (A) is decomposed per 1 minute, more preferably a temperature at which 10% by mass or less of the resin (A) is decomposed per 1 minute, and further preferably a temperature at which 5% by mass or less of the resin (A) is decomposed per 1 minute.

In the (III), the means to blow the gas to the resin (A) is not particularly limited, and it may be mentioned, for example, an air blower as shown in FIG. 1 and the like. A speed at which the gas is blown is not particularly limited, and it is preferably about 1 to 1,000 L/min. When such a method of decomposition and removal is employed, it is possible to decompose and remove the resin (A) from the side of the surface in contact with the gas while suppressing collapse or breakdown of the pattern.

As the gas to be blown to the resin (A), it is preferable to use a gas containing either of a gas which shows acidity in an aqueous solution or water vapor, or both of these. By using such a gas, it is possible to decompose and remove the resin (A) more efficiently. Examples of gases which show acidity in an aqueous solution may be exemplified by carbon dioxide, nitrogen dioxide, hydrogen chloride, hydrogen bromide, sulfur dioxide and the like. The gas which shows acidity in an aqueous solution is preferably a material having a vapor pressure of 1,013 hPa or more at 20° C., particularly preferably carbon dioxide. When a gas containing either of a gas which shows acidity in an aqueous solution or water vapor, or both of these is used, an accompanying gas for adjusting the concentration of the gas which shows acidity in an aqueous solution or the water vapor may be used. As the accompanying gas, it is usually preferable to use an inert gas such as nitrogen, argon and the like. A concentration of the gas which shows acidity in an aqueous solution may be appropriately adjusted according to the kind of the gas so that the decomposition rate of the desired resin (A) can be obtained. For example, when the carbon dioxide is used, the concentration is preferably 1 ppm or more and 50% by volume or less, and more preferably 100 ppm or more and 10% by volume or less. In addition, a pressure in the case of using water vapor is preferably the saturated vapor pressure of the water vapor at the temperature of the gas or less. The concentration in the case of using the water vapor is preferably a concentration that satisfies the pressure, for example, 1 ppm or more and the saturated vapor pressure concentration of the water vapor at the temperature of the gas or less. If it is the saturated vapor pressure or less, condensation of the vapor on the semiconductor substrate onto which the pattern has been formed can be prevented, so that collapse or breakdown of the pattern can be prevented.

When the method of cleaning and drying a semiconductor substrate of the present invention is employed, particularly in the substrate onto which a pattern with a high aspect ratio of 20:1, it is possible to suppress the collapse or breakdown of the pattern which occurs at the time of drying the cleaning solution after cleaning the substrate, further suppress the decomposition of the resin at the bottom of the pattern as observed when the heat-decomposable resin is applied, whereby the cleaning solution can be removed efficiently, without using a specific device such as supercritical cleaning. As a result, there is no collapse or breakdown of the pattern, and a semiconductor substrate from which minute particles and stain are removed by cleaning can be obtained.

EXAMPLES

In the following, the present invention will be more specifically explained by referring to Examples and Comparative Examples, but the present invention is not limited by these.

Measurement of the molecular weight was specifically carried out by the following method. A weight average molecular weight (Mw) and a number average molecular weight (Mn) in terms of polystyrene by gel permeation chromatography (GPC) using tetrahydrofuran as an eluent were determined, and the degree of dispersion (Mw/Mn) was obtained. A weight reduction ratio between 30° C. and 250° C. was determined by TG (thermogravimetry) measurement under the conditions of a temperature rise of 10° C./min in a helium atmosphere using a differential thermal balance.

[Synthesis Example] Synthesis of Heat-Decomposable Polymer (the Resin (A)) Having Acetal Structure (Synthesis Example 1) Synthesis of Heat-Decomposable Polymer (A1) (the Following Formula)

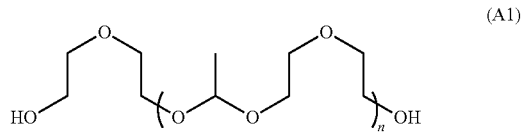

To a mixture of 3.8 g of a cation exchange resin (Amberlyst (Registered Trademark) 15) and 100 g of ethyl acetate was added 100 g of diethylene glycol monovinyl ether at room temperature, and the resulting mixture was further stirred for 3 hours. To the mixture was added 0.8 g of triethylamine to stop the reaction, and the mixture was filtered to remove the cation exchange resin. The filtrate was concentrated under reduced pressure to obtain 100 g of a heat-decomposable polymer (A1) as a high viscous liquid. When the molecular weight and the degree of dispersion thereof were obtained, these were Mw=5,200 and Mw/Mn=2.64. A 5% PGMEA solution of the heat-decomposable polymer (A1) was coated onto a silicon wafer and baked at 80° C. to form a sample onto which a polymer film with a thickness of 1,800 Å had been formed. When each sample was baked under the conditions of changing the temperature to each 5° C. between 150° C. to 180° C. for each 1 minute, then, the film thickness of the polymer film of the sample baked at 165° C. became about 50%, so that it could be found that the decomposition temperature of the heat-decomposable polymer (A1) was about 165° C. Further, by the baking at 200° C. with increased temperature, no polymer film remained on the wafer.

The results of the analysis by $^1$H-NMR and $^{13}$C-NMR of the synthesized heat-decomposable polymer (A1) are shown below.

$^1$H-NMR (600 MHz in DMSO-d6):
δ=1.78 (51H, d, J=5.1 Hz), 3.40-3.65 (136H, m), 4.52 (2H, t, J=5.5 Hz), 4.70 (17H, q, H=5.1 Hz)

From the results of the analysis by $^1$H-NMR, the repeating unit "n" was determined to be 17.

$^{13}$C-NMR (150 MHz in DMSO-d6):
δ=19.60, 60.23, 64.04, 69.88, 72.33, 99.29

(Synthesis Example 2) Synthesis of Heat-Decomposable Polymer (A2) (the Following Formula)

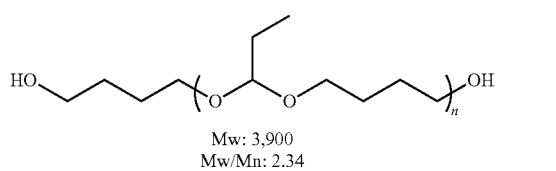

Mw: 3,900
Mw/Mn: 2.34

A heat-decomposable polymer (A2) was synthesized by a method similar to (Synthesis Example 1) except that the raw material species was changed. When the decomposition temperature was measured in the same manner as in Synthesis Example 1, the decomposition temperature of the heat-decomposable polymer (A2) was 170° C. Further, no polymer film remained on the wafer by the baking at 200° C. with increased temperature.

Example 1

In the following Examples 1 to 4, cleaning and drying of the substrate were carried out by the method shown in FIG. 1.

A columnar processed pattern containing $SiO_2$ which has the aspect ratio shown in Table 1 was formed on an Si substrate by dry etching. The cleaning solution (water or IPA (isopropyl alcohol)) shown in Table 2 was impregnated into the pattern to prepare a substrate before drying. Onto the substrate before drying was added dropwise 10 mL of a solution of a composition containing propylene glycol methyl ether acetate (hereinafter referred to as PGMEA) containing 5% by mass of the heat-decomposable polymer (A1) (polymer) synthesized in Synthesis Example 1 and propylene glycol monomethyl ether (hereinafter referred to as PGME) each in an amount of 50% by mass, and spin-coated, then, the substrate was baked at 100° C. to remove the solvent.

As a result, the polymer was filled in the gap of the substrate pattern, and no breakdown of the processed pattern was observed. Subsequently, while cooling the substrate to 20° C., air (0.03% by volume of carbon dioxide, 1% by volume of water vapor, and the remainder being nitrogen, oxygen and the like) was blown to the polymer at 200° C. which is the decomposition temperature of the polymer or higher and 1 L/min. After 10 minutes, all of the polymer filled in the gap was decomposed and volatilized, no polymer in the gap of the processed pattern was observed and no collapse of the processed pattern was observed. The combinations of the pattern and the cleaning solution had changed were made Examples 1-1 to 1-6, respectively, and the results are shown in Table 2.

TABLE 1

| Pattern | Height | Diameter | Aspect ratio |
| --- | --- | --- | --- |
| 1 | 800 nm | 40 nm | 20:1 |
| 2 | 2,000 nm | 40 nm | 50:1 |
| 3 | 4,000 nm | 40 nm | 100:1 |

TABLE 2

| Example | Pattern | Cleaning solution | Pattern shape after filling polymer | Pattern shape after removing polymer with hot air by decomposition |
| --- | --- | --- | --- | --- |
| 1-1 | 1 | Water | No collapse | Neither collapse nor breakdown |
| 1-2 | 1 | IPA | No collapse | Neither collapse nor breakdown |
| 1-3 | 2 | Water | No collapse | Neither collapse nor breakdown |
| 1-4 | 2 | IPA | No collapse | Neither collapse nor breakdown |
| 1-5 | 3 | Water | No collapse | Neither collapse nor breakdown |
| 1-6 | 3 | IPA | No collapse | Neither collapse nor breakdown |

Example 2

By using the heat-decomposable polymer (A2) synthesized in Synthesis Example 2, cleaning and drying of the substrate were carried out in the same procedure as in Example 1. The combinations of the pattern and the cleaning solution had changed were made Examples 2-1 to 2-6, respectively, and the results are shown in Table 3.

TABLE 3

| Example | Pattern | Cleaning solution | Pattern shape after filling polymer | Pattern shape after removing polymer with hot air by decomposition |
| --- | --- | --- | --- | --- |
| 2-1 | 1 | Water | No collapse | Neither collapse nor breakdown |
| 2-2 | 1 | IPA | No collapse | Neither collapse nor breakdown |
| 2-3 | 2 | Water | No collapse | Neither collapse nor breakdown |
| 2-4 | 2 | IPA | No collapse | Neither collapse nor breakdown |
| 2-5 | 3 | Water | No collapse | Neither collapse nor breakdown |
| 2-6 | 3 | IPA | No collapse | Neither collapse nor breakdown |

Example 3

By using the heat-decomposable polymer (A1) synthesized in Synthesis Example 1, cleaning and drying of the substrate were carried out in the same procedure as in Example 1 except for blowing a gas containing 0.5% by volume of carbon dioxide and 99.5% by volume of nitrogen at 250° C. and 2 L/min in place of the air at 200° C. in Example 1. The combinations of the pattern and the cleaning solution had changed were made Examples 3-1 to 3-6, respectively, and the results are shown in Table 4.

TABLE 4

| Example | Pattern | Cleaning solution | Pattern shape after filling polymer | Pattern shape after removing polymer with hot air by decomposition |
| --- | --- | --- | --- | --- |
| 3-1 | 1 | Water | No collapse | Neither collapse nor breakdown |
| 3-2 | 1 | IPA | No collapse | Neither collapse nor breakdown |
| 3-3 | 2 | Water | No collapse | Neither collapse nor breakdown |
| 3-4 | 2 | IPA | No collapse | Neither collapse nor breakdown |
| 3-5 | 3 | Water | No collapse | Neither collapse nor breakdown |
| 3-6 | 3 | IPA | No collapse | Neither collapse nor breakdown |

Example 4

By using the heat-decomposable polymer (A1) synthesized in Synthesis Example 1, cleaning and drying of the substrate were carried out in the same procedure as in Example 1 except for blowing a gas containing 0.5% by volume of water vapor and 99.5% by volume of nitrogen at 250° C. and 1 L/min in place of the air at 200° C. in Example 1. The combinations of the pattern and the cleaning solution had changed were made Examples 4-1 to 4-6, respectively, and the results are shown in Table 5.

TABLE 5

| Example | Pattern | Cleaning solution | Pattern shape after filling polymer | Pattern shape after removing polymer with hot air by decomposition |
|---|---|---|---|---|
| 4-1 | 1 | Water | No collapse | Neither collapse nor breakdown |
| 4-2 | 1 | IPA | No collapse | Neither collapse nor breakdown |
| 4-3 | 2 | Water | No collapse | Neither collapse nor breakdown |
| 4-4 | 2 | IPA | No collapse | Neither collapse nor breakdown |
| 4-5 | 3 | Water | No collapse | Neither collapse nor breakdown |
| 4-6 | 3 | IPA | No collapse | Neither collapse nor breakdown |

Comparative Example 1

When cleaning and drying of the substrate were carried out in the same procedure as in Example 1 except that the substrate was heated under air (the same composition as in Example 1) atmosphere at 200° C. without cooling the substrate and without blowing the air at the time of removing the polymer, collapse of the processed pattern was observed. The combinations of the pattern and the cleaning solution had changed were made Comparative Examples 1-1 to 1-6, respectively, and the results are shown in Table 6.

TABLE 6

| Comparative Example | Pattern | Cleaning solution | Pattern shape after removing polymer with hot air by decomposition |
|---|---|---|---|
| 1-1 | 1 | Water | Collapse exists |
| 1-2 | 1 | IPA | Collapse exists |
| 1-3 | 2 | Water | Collapse exists |
| 1-4 | 2 | IPA | Collapse exists |
| 1-5 | 3 | Water | Collapse exists |
| 1-6 | 3 | IPA | Collapse exists |

Comparative Example 2

When cleaning and drying of the substrate were carried out in the same procedure as in Example 1 except that the substrate was heated under air atmosphere at 250° C. by cooling the substrate to 10° C. without blowing the air at the time of removing the polymer, the polymer remained between the patterns even after 5 hours passed. The combinations of the pattern and the cleaning solution had changed were made Comparative Examples 2-1 to 2-6, respectively, and the results are shown in Table 7.

TABLE 7

| Comparative Example | Pattern | Cleaning solution | Polymer remaining state after lapse of 5 hours when removing polymer in heated atmosphere by decomposition polymer without blowing with gas |
|---|---|---|---|
| 2-1 | 1 | Water | Polymer remained |
| 2-2 | 1 | IPA | Polymer remained |
| 2-3 | 2 | Water | Polymer remained |
| 2-4 | 2 | IPA | Polymer remained |
| 2-5 | 3 | Water | Polymer remained |
| 2-6 | 3 | IPA | Polymer remained |

As shown in Tables 2 to 5, in Examples 1 to 4 in which the treatment was carried out that the cleaning solution on the substrate was replaced with the solution of the composition of the heat-decomposable polymer, and the heated gas was blown to the heat-decomposable polymer by cooling the substrate and maintaining it at a temperature of 0° C. or higher and lower than the decomposition temperature of the heat-decomposable polymer, decomposition of the heat-decomposable polymer at the bottom of the pattern was suppressed, collapse of the processed pattern due to drying did not occur even in the pattern having the aspect ratio of 100:1 since the heat-decomposable polymer was decomposed from the side of the surface in contact with the gas.

On the other hand, as shown in Table 6, in Comparative Example 1 in which the entire substrate was uniformly heat-treated without maintaining the substrate to a temperature of 0° C. or higher and lower than the decomposition temperature of the heat-decomposable polymer, collapse of the processed pattern occurred even in the pattern having the aspect ratio of 20:1.

Further, as shown in Table 7, in Comparative Example 2 in which the substrate was heat-treated without blowing the gas while maintaining the temperature to 0° C. or higher and lower than the decomposition temperature of the heat-decomposable polymer, removal of the polymer was very slow and it could be found out that it was not practically usable process conditions.

From the above, according to the method of cleaning and drying the semiconductor substrate of the present invention, particularly in the substrate onto which a pattern having a high aspect ratio of 20:1 has been formed, it could be found that it is possible to suppress the collapse or breakdown of the pattern which occurs at the time of drying the cleaning solution after cleaning the substrate, further suppress the decomposition of the resin at the bottom of the pattern as observed when the heat-decomposable resin is applied, and the cleaning solution could be efficiently removed, without using a specific device such as supercritical cleaning.

It must be stated here that the present invention is not restricted to the embodiments shown by the above-mentioned embodiments. The above-mentioned embodiments are merely examples so that any embodiments composed of substantially the same technical concept as disclosed in the claims of the present invention and expressing a similar effect are included in the technical scope of the present invention.

EXPLANATION OF REFERENCE NUMERALS

1 . . . Semiconductor substrate, 2 . . . Pattern, 3 . . . Cleaning solution, 4 . . . Composition solution containing resin (A), 5 . . . Resin (A), 6 . . . Air blower, 7 . . . Cooling plate, 8 . . . Surface contacting with gas.

The invention claimed is:

1. A method of cleaning and drying a semiconductor substrate onto which a pattern has been formed, which comprises:
    (I) cleaning the semiconductor substrate onto which a pattern has been formed with a cleaning solution,
    (II) replacing the cleaning solution that remained on the semiconductor substrate with a composition comprising a resin (A) that comprises a repeating unit having an acetal structure represented by the following general formula (1) and a solvent, and removing the solvent in the replaced composition by heating at a temperature lower than a decomposition temperature of the resin (A), and
    (III) blowing a gas having a temperature equal to or higher than the decomposition temperature of the resin (A) to the resin (A) on the semiconductor substrate while maintaining a temperature of the semiconductor substrate onto which a pattern has been formed to 0° C. or higher and lower than the decomposition temperature of the resin (A), to decompose and remove the resin (A) from a side of a surface contacting with the gas,

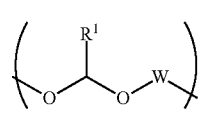
(1)

wherein $R^1$ represents a hydrogen atom or a saturated or unsaturated monovalent organic group having 1 to 30 carbon atoms which may be substituted; and W represents a saturated or unsaturated divalent organic group having 2 to 30 carbon atoms, wherein the gas that is blown to the resin (A) is water vapor or water vapor that comprises a gas that acidifies an aqueous solution, wherein a pressure of the water vapor is made equal to, or lower than, a saturated vapor pressure of the water vapor at the temperature of the gas in (III).

2. The method of cleaning and drying a semiconductor substrate according to claim 1, wherein the resin (A) is a compound represented by any of the following general formulae (1a) to (1c),

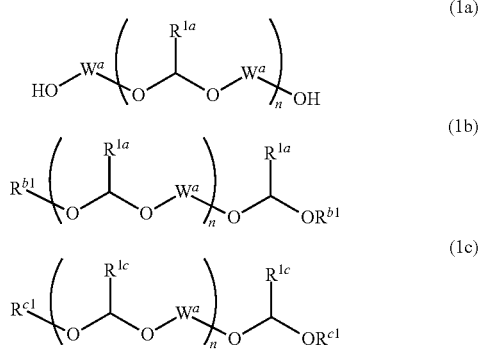

wherein $R^{1a}$ represents an alkyl group having 1 to 4 carbon atoms or an alkenyl group having 2 to 4 carbon atoms; $W^a$ represents a saturated or unsaturated divalent hydrocarbon group having 4 to 10 carbon atoms, which may have an ether bond(s); each of $R^{b1}$ independently represents —$W^a$—OH or a saturated or unsaturated monovalent organic group having 1 to 30 carbon atoms which may be substituted; $R^{1c}$ represents a hydrogen atom, or an aryl group having 6 to 20 carbon atoms or a heteroaryl group having 4 to 20 carbon atoms each of which may be substituted; each of $R^{c1}$ independently represents an alkyl group having 1 to 4 carbon atoms or —$W^a$—OH; and a repeating unit "n" represents an average number of repeating units and is 3 to 2,000.

3. The method of cleaning and drying a semiconductor substrate according to claim 1, wherein an aspect ratio of the pattern is 20:1 or more.

4. The method of cleaning and drying a semiconductor substrate according to claim 1, wherein the cleaning solution is a liquid comprising at least one of water, a water-soluble alcohol and a fluorine compound.

5. The method of cleaning and drying a semiconductor substrate according to claim 1, wherein a temperature of the semiconductor substrate onto which a pattern has been formed is maintained at 0° C. or higher and 100° C. or lower in (III).

6. The method of cleaning and drying a semiconductor substrate according to claim 1, wherein the gas that acidifies an aqueous solution is a gas having a vapor pressure at 20° C. of 1,013 hPa or higher.

7. The method of cleaning and drying a semiconductor substrate according to claim 2, wherein an aspect ratio of the pattern is 20:1 or more.

8. The method of cleaning and drying a semiconductor substrate according to claim 2, wherein the cleaning solution is a liquid comprising at least one of water, a water-soluble alcohol and a fluorine compound.

9. The method of cleaning and drying a semiconductor substrate according to claim 2, wherein a temperature of the semiconductor substrate onto which a pattern has been formed is maintained at 0° C. or higher and 100° C. or lower in (III).

10. The method of cleaning and drying a semiconductor substrate according to claim 3, wherein the cleaning solution is a liquid comprising at least one of water, a water-soluble alcohol and a fluorine compound.

11. The method of cleaning and drying a semiconductor substrate according to claim 3, wherein a temperature of the semiconductor substrate onto which a pattern has been formed is maintained at 0° C. or higher and 100° C. or lower in (III).

12. The method of cleaning and drying a semiconductor substrate according to claim 4, wherein a temperature of the semiconductor substrate onto which a pattern has been formed is maintained at 0° C. or higher and 100° C. or lower in (III).

13. The method of cleaning and drying a semiconductor substrate according to claim 7, wherein the cleaning solution is a liquid comprising at least one of water, a water-soluble alcohol and a fluorine compound.

14. The method of cleaning and drying a semiconductor substrate according to claim 7, wherein a temperature of the semiconductor substrate onto which a pattern has been formed is maintained at 0° C. or higher and 100° C. or lower in (III).

15. The method of cleaning and drying a semiconductor substrate according to claim 8, wherein a temperature of the semiconductor substrate onto which a pattern has been formed is maintained at 0° C. or higher and 100° C. or lower in (III).

16. The method of cleaning and drying a semiconductor substrate according to claim 10, wherein a temperature of the semiconductor substrate onto which a pattern has been formed is maintained at 0° C. or higher and 100° C. or lower in (III).

17. The method of cleaning and drying a semiconductor substrate according to claim 13, wherein a temperature of the semiconductor substrate onto which a pattern has been formed is maintained at 0° C. or higher and 100° C. or lower in (III).

* * * * *